US012640283B2

(12) United States Patent
Hasegawa et al.

(10) Patent No.: US 12,640,283 B2
(45) Date of Patent: May 26, 2026

(54) NOISE REDUCTION SHEET AND WIRE HARNESS

(71) Applicant: YAZAKI CORPORATION, Tokyo (JP)

(72) Inventors: Itsuki Hasegawa, Makinohara (JP); Kaori Usami, Makinohara (JP); Jin Watanabe, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 94 days.

(21) Appl. No.: 18/946,901

(22) Filed: Nov. 13, 2024

(65) Prior Publication Data

US 2025/0069779 A1      Feb. 27, 2025

Related U.S. Application Data

(63) Continuation of application No. PCT/JP2023/036315, filed on Oct. 5, 2023.

(30) Foreign Application Priority Data

Oct. 31, 2022      (JP) ................................. 2022-174041

(51) Int. Cl.
H05K 9/00          (2006.01)
H01B 7/18          (2006.01)
(Continued)

(52) U.S. Cl.
CPC ......... H01B 7/1805 (2013.01); H05K 9/0075 (2013.01); H05K 9/0098 (2013.01); H01B 7/0045 (2013.01); H01F 1/42 (2013.01)

(58) Field of Classification Search
CPC ........................... H05K 9/0098; H05K 9/0075
See application file for complete search history.

(56) References Cited

U.S. PATENT DOCUMENTS

2009/0120681 A1*    5/2009    Matsuzaki ........... H05K 9/0098
                                                                      174/350
2017/0164528 A1*    6/2017    Wakabayashi ....... H05K 1/0228
(Continued)

FOREIGN PATENT DOCUMENTS

JP          H03-116094 U      12/1991
JP          2001-167933 A       6/2001
(Continued)

OTHER PUBLICATIONS

International Search Report for PCT/JP2023/036315 dated Dec. 19, 2023.

*Primary Examiner* — Hung V Ngo
(74) *Attorney, Agent, or Firm* — KENEALY VAIDYA LLP

(57) ABSTRACT

A noise reduction sheet includes a flexible sheet containing a soft magnetic material, in which a plurality of first grooves extending in a first direction, a plurality of second grooves extending in a second direction, and a plurality of third grooves extending in a third direction are provided on a first surface of the sheet, the first surface is divided into a plurality of regular triangular regions by the first grooves, the second grooves, and the third grooves, and each of the first grooves, the second grooves, and the third grooves has a cross-sectional shape in which a groove width increases toward an opening along a depth direction of the groove.

6 Claims, 9 Drawing Sheets

(51) Int. Cl.
    *H01B 7/00*         (2006.01)
    *H01F 1/42*         (2006.01)

(56)               References Cited

U.S. PATENT DOCUMENTS

| | | | |
|---|---|---|---|
| 2021/0021112 A1* | 1/2021 | Oshino | H02G 3/0437 |
| 2024/0055167 A1* | 2/2024 | Ohmae | H01F 1/34 |
| 2024/0404725 A1* | 12/2024 | Hasegawa | H01B 7/184 |
| 2025/0183634 A1* | 6/2025 | Nakashima | H02G 3/0481 |

FOREIGN PATENT DOCUMENTS

| | | |
|---|---|---|
| JP | 2014-225552 A | 12/2014 |
| WO | 2006/129704 A1 | 12/2006 |

* cited by examiner

NOISE REDUCTION SHEET AND WIRE HARNESS

CROSS-REFERENCE TO RELATED APPLICATION(S)

This application is a continuation application of International Application No. PCT/JP2023/036315 filed on Oct. 5, 2023 which claims the benefit of priority from Japanese Patent Application No. 2022-174041 filed on Oct. 31, 2022 and designating the U.S., the entire contents of which are incorporated herein by reference.

BACKGROUND OF THE INVENTION

1. Field of the Invention

The present invention relates to a noise reduction sheet and a wire harness.

2. Description of the Related Art

Conventionally, there is a technique for reducing noise. Japanese Patent Application Laid-open No. 2014-225552 discloses a ferrite plate obtained by forming a protective layer on sintered ferrite plates subjected to a cutting process to prevent small pieces separated from each other along cuts from falling off. In the ferrite plate of Japanese Patent Application Laid-open No. 2014-225552, protective layers each including an adhesive layer and an ink layer are formed on front and back surfaces of the sintered ferrite plates formed in a square thin plate shape (sheet shape) having a thickness dimension of 50 μm to 1.0 mm.

In the configuration in which the square sintered ferrite plates are arranged, the bending directions tend to be limited to two directions orthogonal to each other. Thus, there has been a demand for a noise reduction sheet improved in degree of freedom in deformation when the noise reduction sheet is attached to an object.

SUMMARY OF THE INVENTION

An object of the present invention is to provide a noise reduction sheet and a wire harness capable of improving the degree of freedom in deformation.

Solution to Problem

In order to achieve the above mentioned object, a noise reduction sheet according to one aspect of the present invention includes a flexible sheet containing a soft magnetic material, wherein a plurality of first grooves extending in a first direction, a plurality of second grooves extending in a second direction, and a plurality of third grooves extending in a third direction are provided on a first surface of the sheet, the first surface is divided into a plurality of regular triangular regions by the first grooves, the second grooves, and the third grooves, each of the first grooves, the second grooves, and the third grooves has a cross-sectional shape in which a groove width increases toward an opening along a depth direction of the groove, and wherein each of the first grooves, the second grooves, and the third grooves has first sections and second sections having a narrower groove width than the first sections, the first sections and the second sections being alternately arranged, and the first sections are arranged in such a manner that the first surface is divided into a plurality of regular hexagonal regions constituting a honeycomb structure.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, a noise reduction sheet and a wire harness according to an embodiment of the present invention will be described in detail with reference to the drawings. Note that the present invention is not limited by the present embodiment. In addition, the components in the following embodiment include those that can be easily imagined by those skilled in the art or those that are substantially the same.

EMBODIMENT

Figure 1:
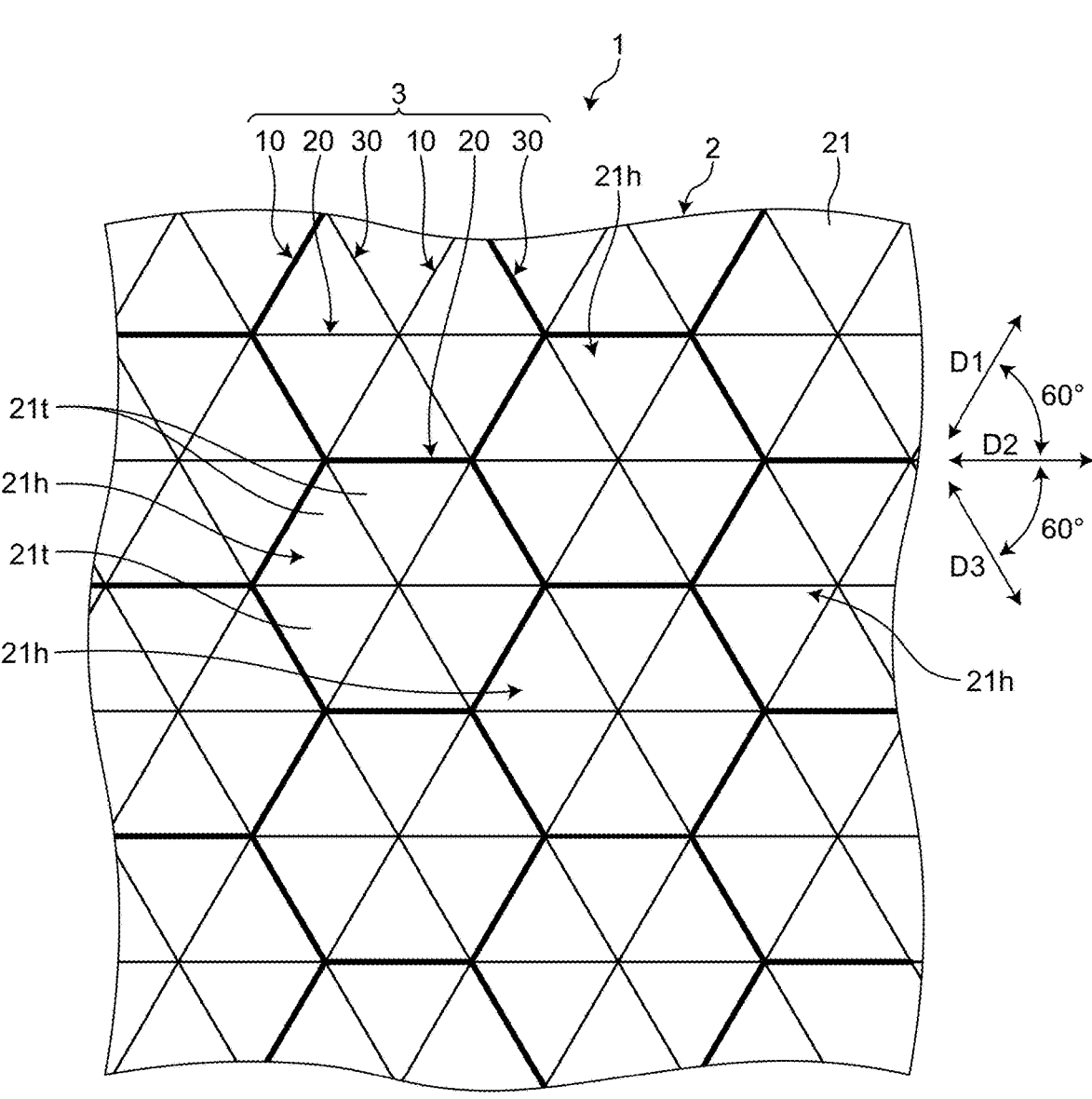
FIG. 1 is a plan view of a noise reduction sheet according to an embodiment.
Figure 3:
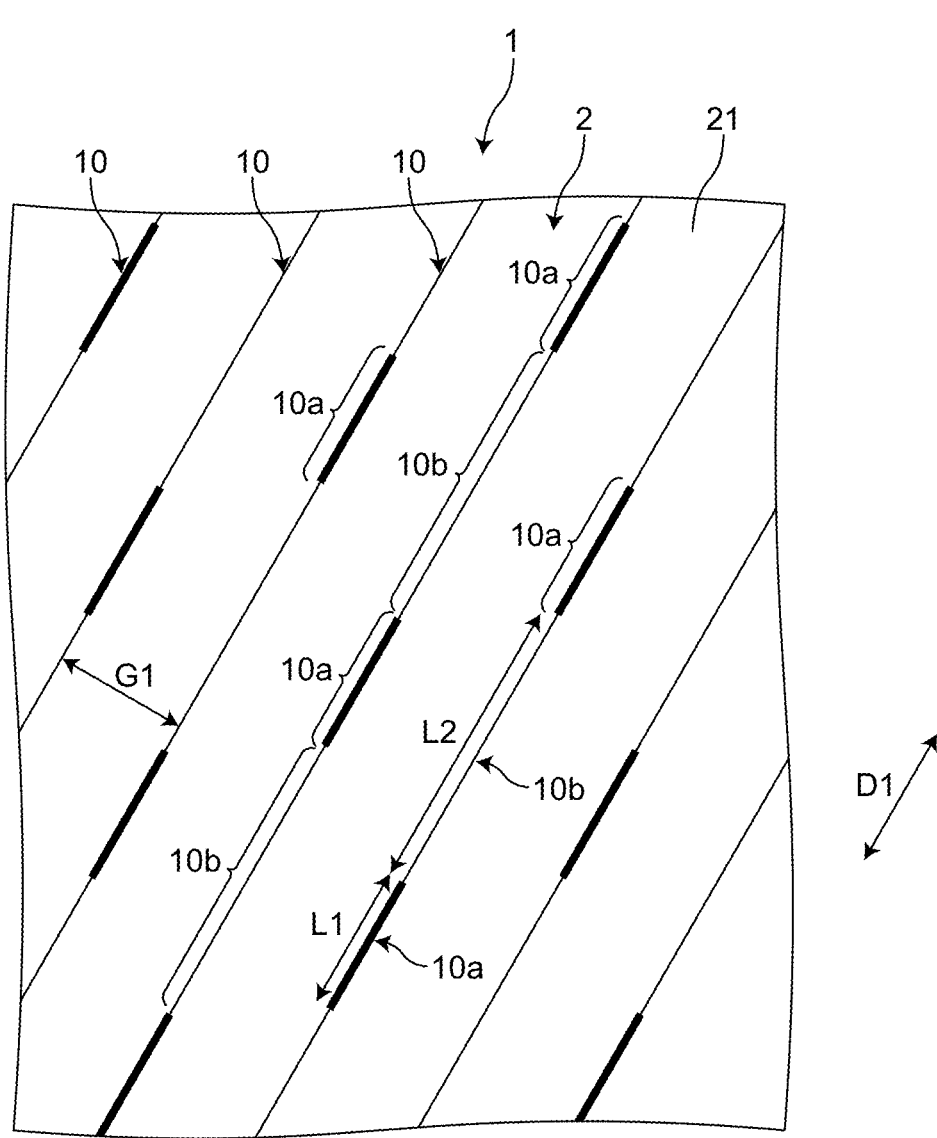
FIG. 3 is a plan view illustrating first grooves according to the embodiment.
Figure 4:
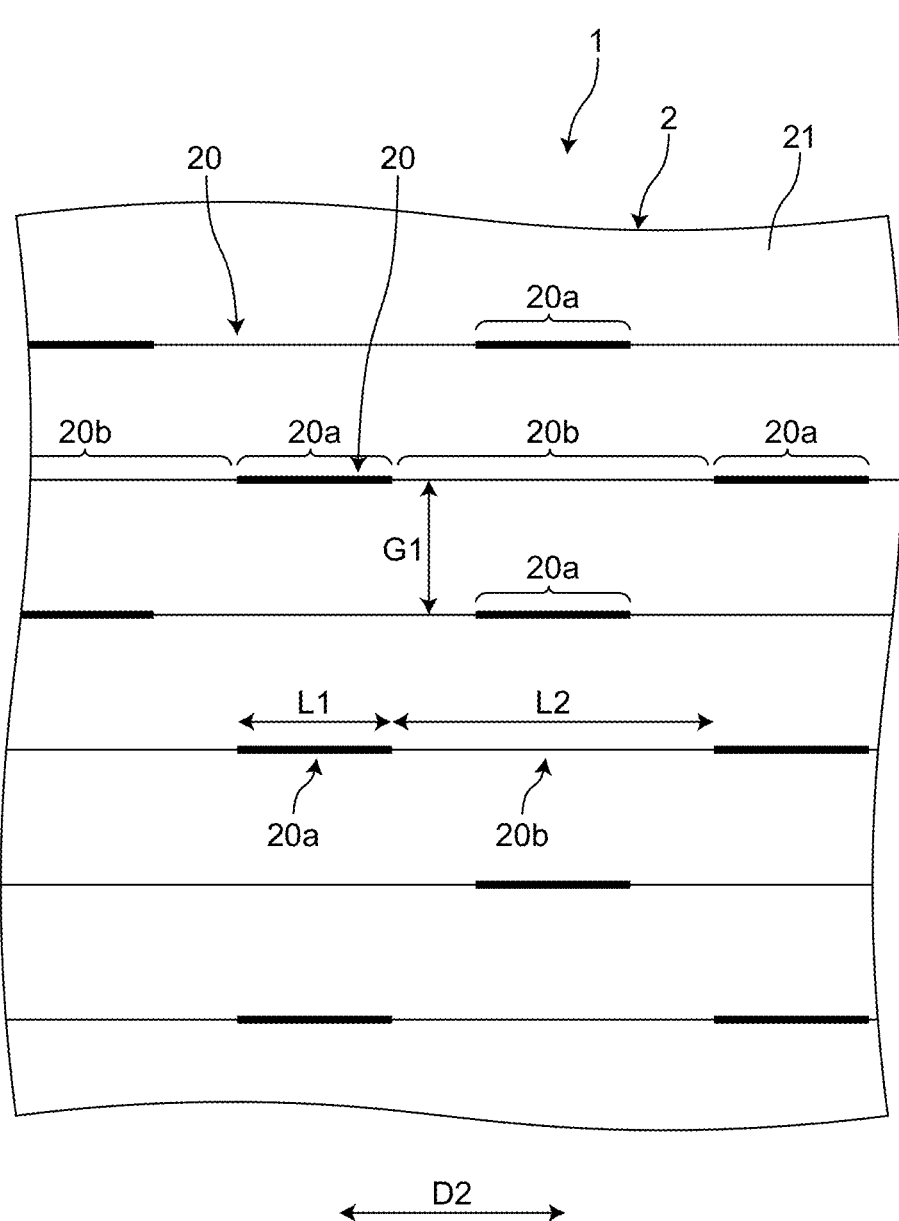
FIG. 4 is a plan view illustrating second grooves according to the embodiment.
Figure 5:
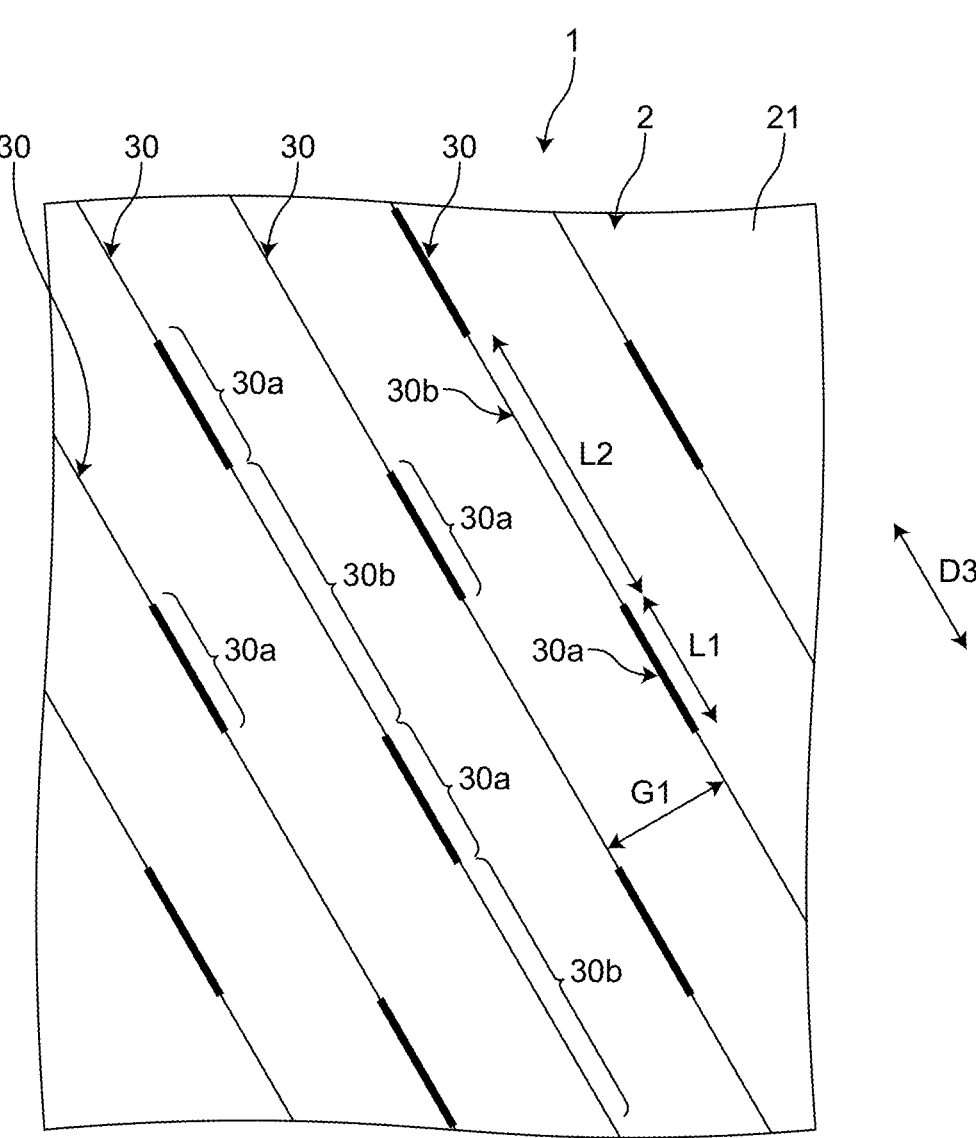
FIG. 5 is a plan view illustrating third grooves according to the embodiment.
Figure 6:
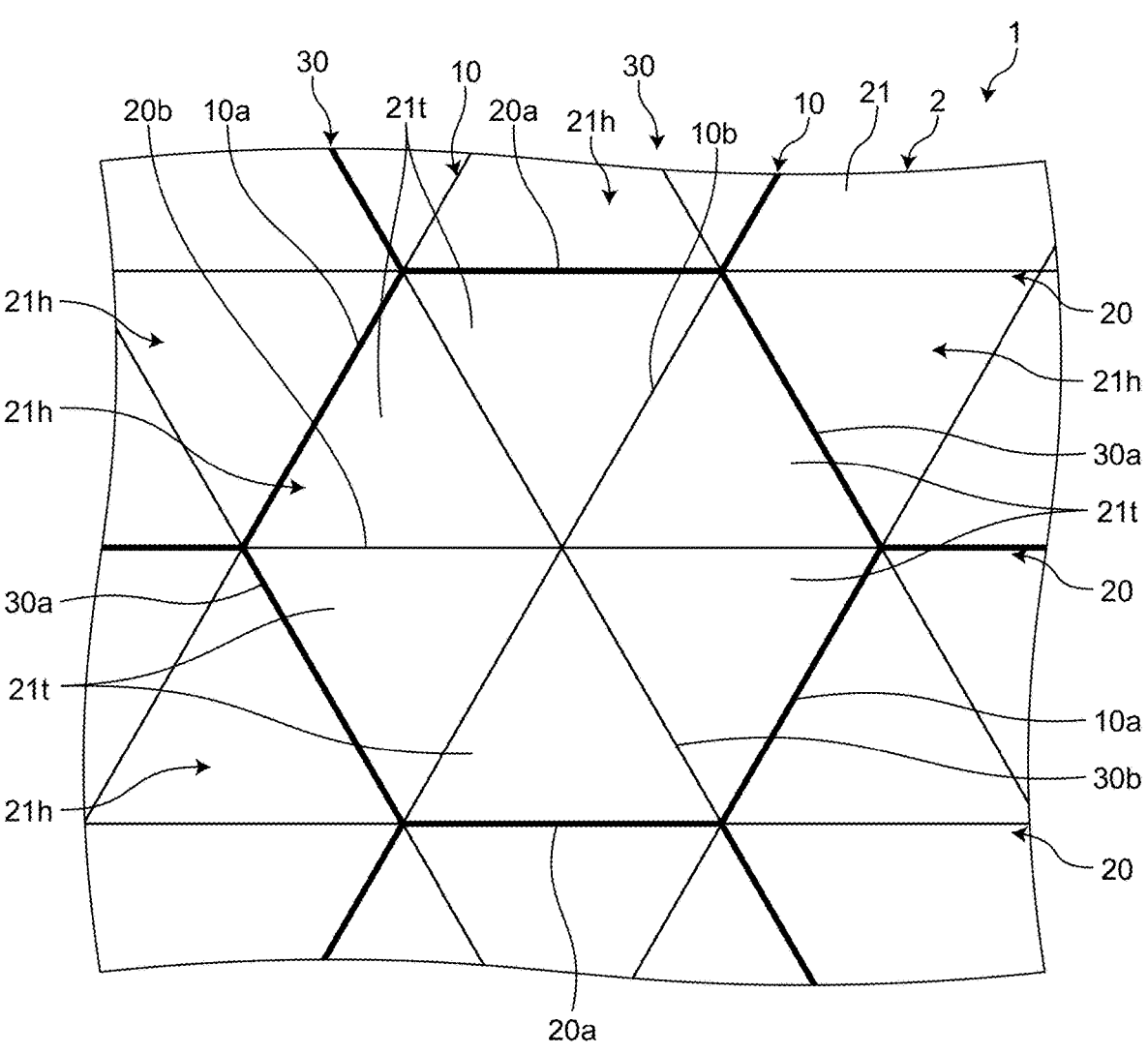
FIG. 6 is a plan view illustrating a regular hexagonal region according to the embodiment.
Figure 7:
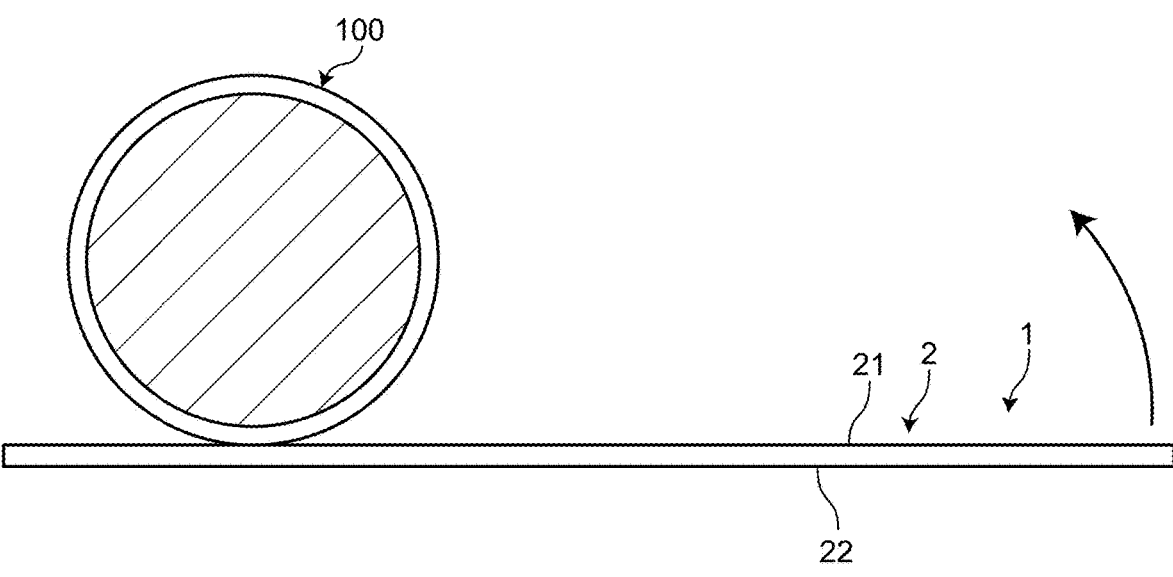
FIG. 7 is a view for explaining how the sheet is wound around a cable.
Figure 8:
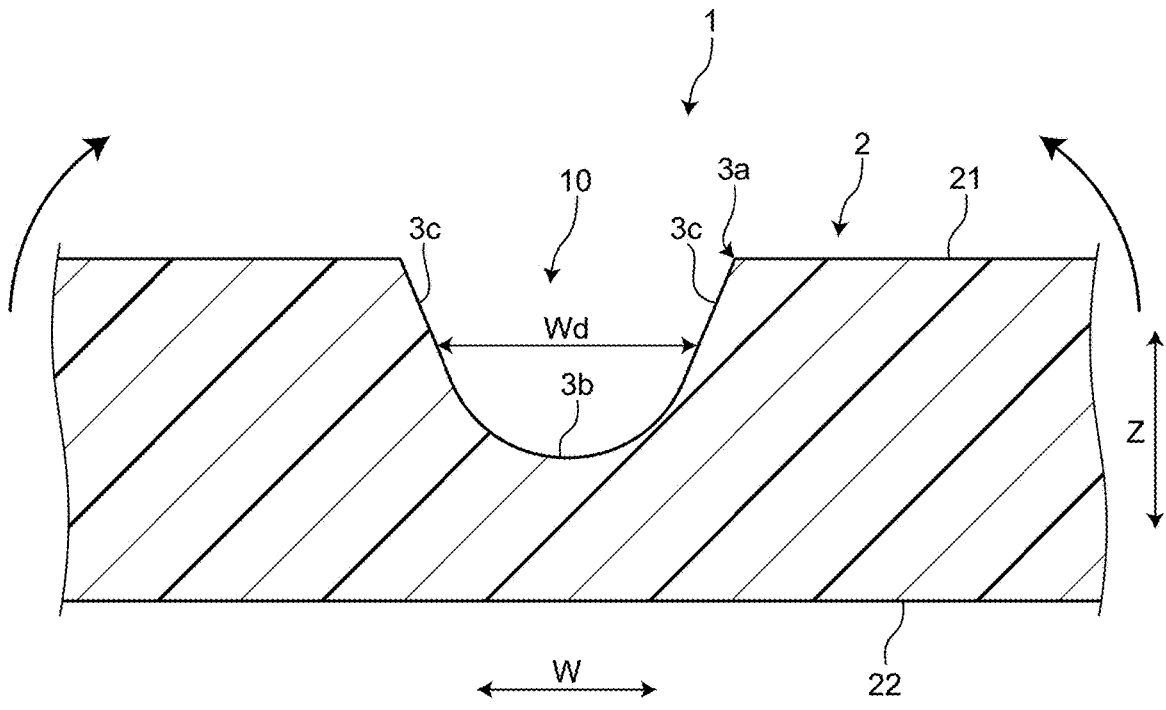
FIG. 8 is a cross-sectional view of the first groove according to the embodiment.
Figure 9:
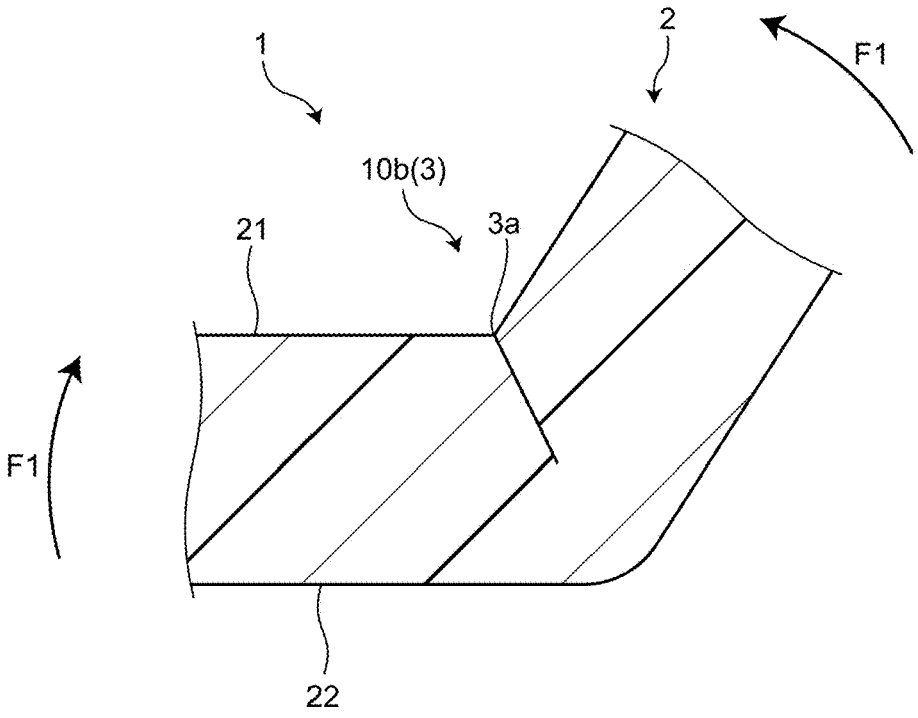
FIG. 9 is a cross-sectional view of the first groove in a closed state.
Figure 10:
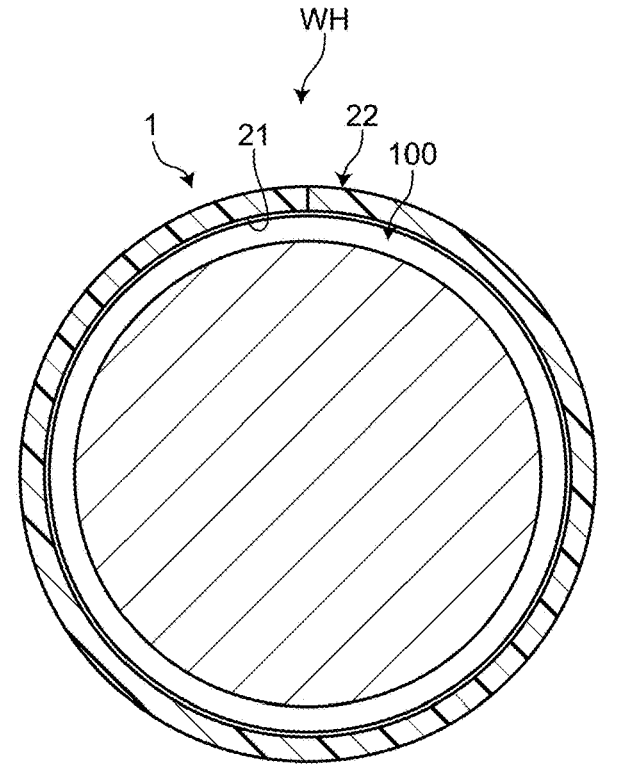
FIG. 10 is a cross-sectional view of a wire harness according to the embodiment.
Figure 11:
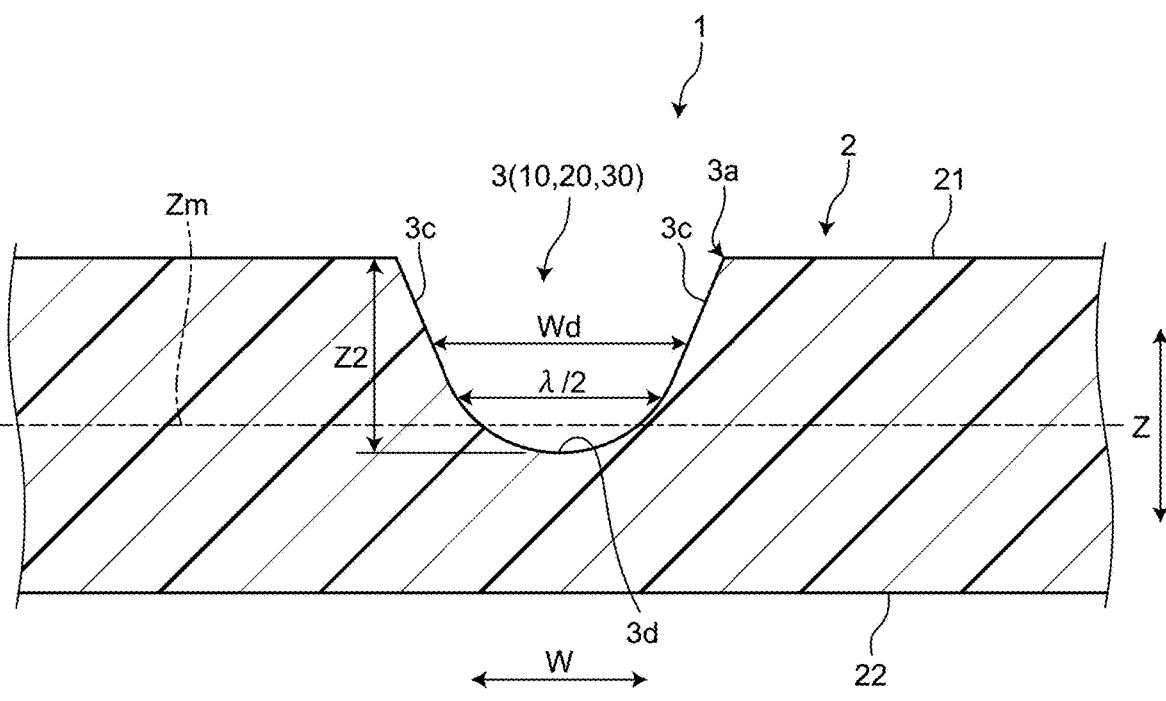
FIG. 11 is a cross-sectional view illustrating a narrow portion according to the embodiment.
Figure 12:
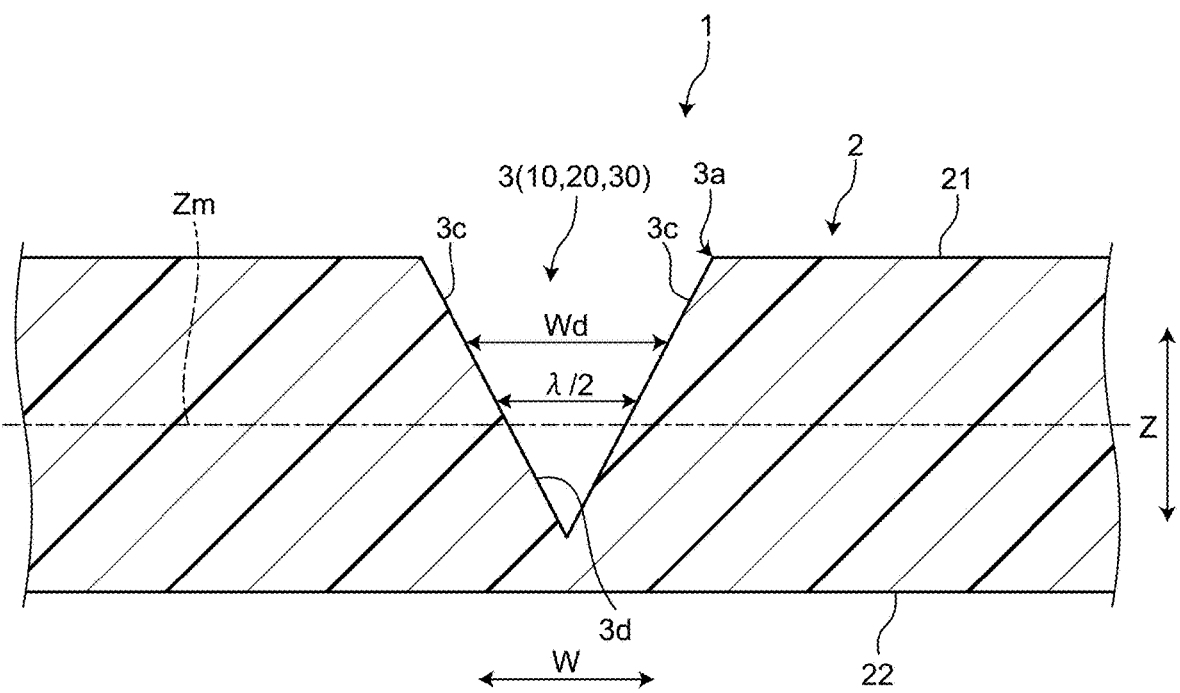
FIG. 12 is a cross-sectional view illustrating another narrow portion according to the embodiment.

An embodiment will be described with reference to FIGS. 1 to 12. The present embodiment relates to a noise reduction sheet and a wire harness. FIG. 1 is a plan view of the noise reduction sheet according to the embodiment, FIG. 2 is a cross-sectional view of the noise reduction sheet according to the embodiment, FIG. 3 is a plan view illustrating first grooves according to the embodiment, FIG. 4 is a plan view illustrating second grooves according to the embodiment, FIG. 5 is a plan view illustrating third grooves according to the embodiment, FIG. 6 is a plan view illustrating a regular hexagonal region according to the embodiment, FIG. 7 is a view for explaining how the sheet is wound around a cable, FIG. 8 is a cross-sectional view of the first groove according to the embodiment, FIG. 9 is a cross-sectional view of the first groove in a closed state, FIG. 10 is a cross-sectional view of a wire harness according to the embodiment, FIG. 11 is a cross-sectional view illustrating a narrow portion according to the embodiment, and FIG. 12 is a cross-sectional view illustrating another narrow portion according to the embodiment.

A noise reduction sheet 1 according to the present embodiment includes a flexible sheet 2 containing a soft magnetic material such as ferrite. The sheet 2 is, for example, a member in which the soft magnetic material is dispersed in a synthetic resin sheet. The soft magnetic material included in the sheet 2 may be a large number of thin pieces of soft magnetic material. The synthetic resin may be rubber or polyvinyl chloride (PVC), or may be another synthetic resin. The synthetic resin for the sheet 2 is an elastically deformable synthetic resin, and has flexibility in a molded state in a sheet shape.

Figure 2:
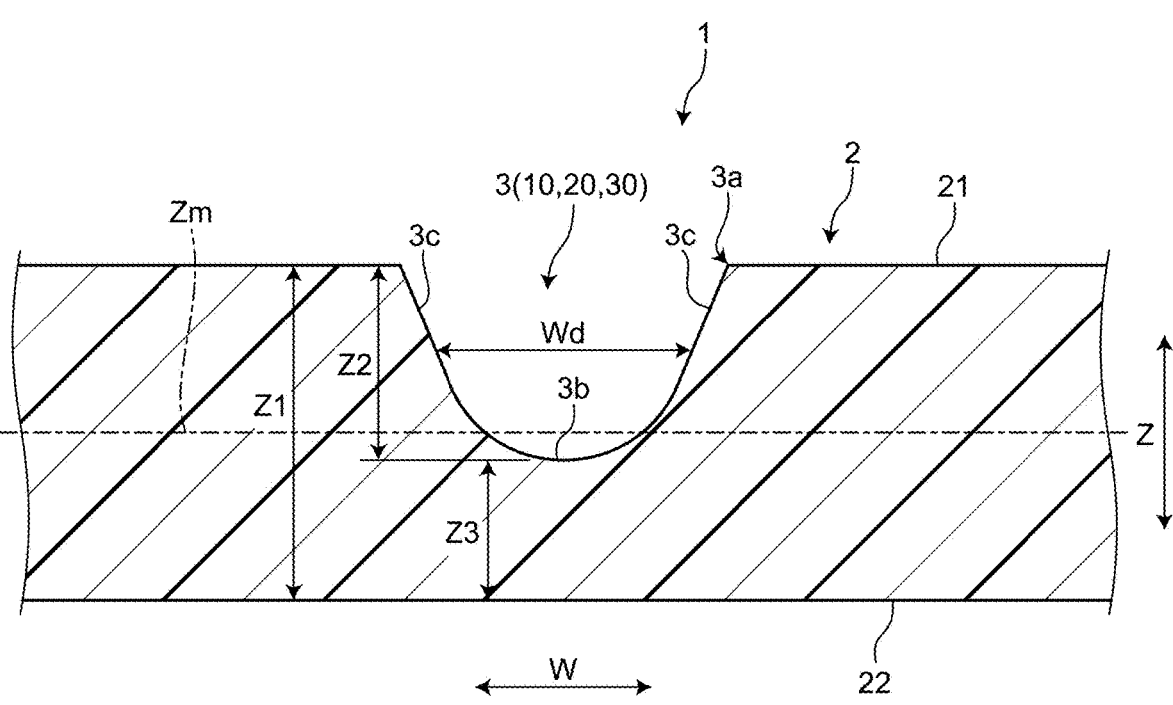
FIG. 2 is a cross-sectional view of the noise reduction sheet according to the embodiment.

As illustrated in FIG. 2, the sheet 2 has a first surface 21 and a second surface 22. The first surface 21 is a surface directed toward a noise emitter such as a cable. The second surface 22 is a surface opposite to the first surface 21.

As illustrated in FIG. 1, the first surface 21 is divided into a plurality of regular triangular regions 21t by a plurality of grooves 3. The plurality of grooves 3 are formed by, for example, a mold for molding the sheet 2. In this case, the mold forming the first surface 21 has protrusions corresponding to the grooves 3. The plurality of grooves 3 includes a plurality of first grooves 10, a plurality of second grooves 20, and a plurality of third grooves 30. The first grooves 10 extend in a first direction D1. The second grooves 20 extend in a second direction D2. The third grooves 30 extend in a third direction D3.

The first grooves 10, the second grooves 20, and the third grooves 30 form a plurality of regular triangular regions 21t on the first surface 21. An intersection angle of the second direction D2 with respect to the first direction D1 is 60 [°]. That is, in a portion where the first groove 10 and the second groove 20 intersect each other, the intersection angle of the second groove 20 on the acute angle side with respect to the first groove 10 is 60 [°]. Similarly, an intersection angle of the third direction D3 with respect to the second direction D2 is 60 [°]. That is, in a portion where the second groove 20 and the third groove 30 intersect each other, the intersection angle of the third groove 30 on the acute angle side with respect to the second groove 20 is 60 [°]. An intersection angle of the first direction D1 with respect to the third direction D3 is 60 [°]. That is, in a portion where the third groove 30 and the first groove 10 intersect each other, the intersection angle of the first groove 10 on the acute angle side with respect to the third groove 30 is 60 [°]. The first groove 10, the second groove 20, and the third groove 30 are arranged to intersect each other at the same intersection point.

FIG. 2 illustrates a cross-sectional shape of the groove 3. The cross-sectional shape of the groove 3 is a shape in which a groove width Wd increases toward an opening 3a along a depth direction Z of the groove 3. The exemplified groove 3 has a curved wall 3b and a pair of straight walls 3c. The curved wall 3b is a wall portion having a curved cross-sectional shape. The curved wall 3b is provided on the bottom side of the groove 3. The cross-sectional shape of the curved wall 3b is, for example, an arc shape or a hyperbolic shape. The cross-sectional shape of the curved wall 3b is preferably a continuous curved shape. The curved wall 3b is curved outward in a groove width direction W. That is, the groove 3 has a curved cross-sectional shape outward in the groove width direction W.

The straight walls 3c are provided on the side of the opening 3a in the groove 3. The pair of straight walls 3c faces each other in the groove width direction W. The straight wall 3c is inclined with respect to the depth direction Z of the groove 3. More specifically, the pair of straight walls 3c are inclined such that the groove width Wd increases toward the opening 3a along the depth direction Z. The straight walls 3c are continuous with the curved wall 3b. An extending direction of the straight wall 3c is a tangential direction of an end of the curved wall 3b.

The groove 3 is provided beyond a middle line Zm in the depth direction Z of the sheet 2 toward the second surface 22. That is, a depth Z2 of the groove 3 is larger than half of a thickness Z1 of the sheet 2. The thickness Z1 of the sheet 2 is determined to achieve a desired noise reduction effect. In the noise reduction sheet 1 attached to a charging cable, the thickness Z1 of the sheet 2 may be several millimeters. A thickness Z3 from the bottom of the groove 3 to the second surface 22 is set in consideration of the balance between the flexibility of the sheet 2, the strength of the sheet 2, and the noise reduction effect.

On the first surface 21 illustrated in FIG. 3, only the first grooves 10 are illustrated, and the second grooves 20 and the third grooves 30 are not illustrated. As illustrated in FIG. 3, the plurality of first grooves 10 are arranged at equal intervals each being an interval G1. The interval G1 is an inter-line distance in a direction orthogonal to the first direction D1. The inter-line distance is a distance from the center line of one first groove 10 to the center line of the adjacent first groove 10.

The first groove 10 has first sections 10a and second sections 10b. In the first groove 10, the first sections 10a and the second sections 10b are alternately arranged along the first direction D1. The second section 10b is a narrow portion having a narrower groove width Wd than the first section 10a. When the groove width Wd of the first section 10a is Wd1 and the groove width Wd of the second section 10b is Wd2, the following formula (1) is established at the same position in the depth direction Z.

$$Wd1 > Wd2 \tag{1}$$

A length L1 of the first section 10a is a length of one side of the regular triangular region 21t. A length L2 of the second section 10b is twice the length L1 of the first section 10a. The first section 10a of the first groove 10 faces the second section 10b of the adjacent first groove 10. That is, the first sections 10a and the second sections 10b are alternately arranged in the direction orthogonal to the first direction D1.

On the first surface 21 illustrated in FIG. 4, only the second grooves 20 are illustrated, and the first grooves 10 and the third grooves 30 are not illustrated. As illustrated in FIG. 4, the plurality of second grooves 20 are arranged at equal intervals each being an interval G1. The interval G1 is an inter-line distance in a direction orthogonal to the second direction D2.

The second groove 20 has first sections 20a and second sections 20b. In the second groove 20, the first sections 20a and the second sections 20b are alternately arranged along the second direction D2. The second section 20b is a narrow portion having a narrower groove width Wd than the first section 20a. When the groove width Wd of the first section 20a is Wd1 and the groove width Wd of the second section 20b is Wd2, the above formula (1) is established at the same position in the depth direction Z.

The first section 20a has the same length L1 as the first section 10a of the first groove 10, and the second section 20b has the same length L2 as the second section 10b of the first groove 10. The first section 20a of the second groove 20 faces the second section 20b of the adjacent second groove 20. That is, the first sections 20a and the second sections 20b are alternately arranged in the direction orthogonal to the second direction D2.

On the first surface 21 illustrated in FIG. 5, only the third grooves 30 are illustrated, and the first grooves 10 and the second grooves 20 are not illustrated. As illustrated in FIG. 5, the plurality of third grooves 30 are arranged at equal intervals each being an interval G1. The interval G1 is an inter-line distance in a direction orthogonal to the third direction D3.

The third groove 30 has first sections 30a and second sections 30b. In the third groove 30, the first sections 30a and the second sections 30b are alternately arranged along the third direction D3. The second section 30b is a narrow portion having a narrower groove width Wd than the first section 30a. When the groove width Wd of the first section 30a is Wd1 and the groove width Wd of the second section 30b is Wd2, the above equation (1) is established at the same position in the depth direction Z.

The first section 30a has the same length L1 as the first section 10a of the first groove 10, and the second section 30b has the same length L2 as the second section 10b of the first groove 10. The first section 30a of the third groove 30 faces the second section 30b of the adjacent third groove 30. That is, the first sections 30a and the second sections 30b are alternately arranged in the direction orthogonal to the third direction D3.

As illustrated in FIG. 1, the first grooves 10, the second grooves 20, and the third grooves 30 are disposed to divide the first surface 21 into a plurality of regular hexagonal regions 21h. The plurality of regular hexagonal regions 21h constitute a honeycomb structure.

As illustrated in FIG. 6, the regular hexagonal region 21h is formed by a pair of the first sections 10a, a pair of the first sections 20a, and a pair of the first sections 30a. The second sections 10b, 20b, and 30b are diagonal sections of the regular hexagonal region 21h. One regular hexagonal region 21h includes six regular triangular regions 21t. One regular hexagonal region 21h is adjacent to six other regular hexagonal regions 21h, and is surrounded by the six regular hexagonal regions 21h. Two adjacent hexagonal regions 21h are partitioned by one first section 10a, one first section 20a, or one first section 30a.

As can be seen from FIG. 1, the first surface 21 is divided into a plurality of regular hexagonal regions 21h constituting the honeycomb structure. As will be described below, the noise reduction sheet 1 according to the present embodiment has a high degree of freedom in deformation when attached to an object.

FIG. 7 illustrates the noise reduction sheet 1 wound around a cable 100. The cable 100 is, for example, a charging cable for supplying power to a vehicle. The charging cable may be a normal charging cable or a rapid charging cable. The sheet 2 is wound around the cable 100 in such a manner that the cable 100 is covered by the first surface 21.

The sheet 2 having flexibility can be elastically deformed when the sheet 2 is wound around the cable 100. The sheet 2 according to the present embodiment is further deformed such that the grooves 3 are closed, whereby the sheet 2 is easily bent. The grooves 3 include the first grooves 10, the second grooves 20, and the third grooves 30 extending in three different directions. Therefore, when the sheet 2 is wound around the cable 100, the degree of freedom in deformation of the sheet 2 is high. As a comparative example, a ferrite plate in which sintered ferrite plates formed in a square thin plate shape (sheet shape) are arranged will be discussed. The ferrite plate according to the comparative example can be bent in two orthogonal directions, but it is difficult to flexibly cope with other directions.

In the noise reduction sheet 1 according to the present embodiment, since the grooves 3 extending in three different directions are provided, it is possible to flexibly cope with bending in various directions. In addition, the sheet 2 according to the present embodiment attached to the cable 100 can appropriately follow deformation of the cable 100. For example, the sheet 2 according to the present embodiment can flexibly follow bending and stretching of the cable 100 or the like. By appropriately deforming the grooves 3 extending in the three directions according to the bent shape of the cable 100, the sheet 2 can follow the deformation of the cable 100. Furthermore, by appropriately deforming the grooves 3 extending in the three directions, stress is dispersed in the sheet 2.

In addition, the noise reduction sheet 1 according to the present embodiment can flexibly cope with cables 100 having various diameters. The groove width Wd of the groove 3 may be set in such a manner that the noise reduction sheet 1 can be wound around a cable 100 having an assumed minimum diameter. In this case, the grooves 3 may be opened, not completely closed, in a state where the noise reduction sheet 1 is wound around a large-diameter cable 100. However, an opening width of the groove 3 after the sheet 2 is wound around the cable 100 is narrower than an opening width of the groove 3 before the sheet 2 is wound around the cable 100. Therefore, the noise reduction sheet 1 exhibits a sufficient noise reduction effect even when being wound around the large-diameter cable 100.

In the noise reduction sheet 1 according to the present embodiment, the grooves 3 have the first sections 10a, 20a, and 30a and the second sections 10b, 20b, and 30b. As a result, uneven deformation and stress concentration in the sheet 2 are suppressed. As an example, deformation of the sheet 2 by which the first groove 10 is closed as illustrated in FIG. 8 will be described. In this case, while the first sections 10a and the second sections 10b of the first groove 10 are being closed, the sheet 2 is being bent. The second section 10b having a narrow groove width Wd is completely closed earlier than the first section 10a.

FIG. 9 illustrates a cross section of the closed second section 10b. The groove 3 according to the present embodiment is configured such that wall surfaces on both sides adhere to each other when the groove 3 is closed. That is, the shape of the groove 3 is designed, for example, so that the groove 3 is closed without any gap from the bottom of the groove 3 to the opening 3a of the groove 3. Alternatively, the shape of the groove 3 is designed so that at least the opening 3a of the groove 3 is closed without any gap. As a result, the noise reduction sheet 1 exhibits a sufficient noise reduction effect.

The closed second section 10b generates a reaction force against the bending force F1. That is, the rigidity against the bending force F1 is high in the first groove 10. When the sheet 2 is further bent from this state, the first section 10a can be further closed in the first groove 10. Meanwhile, this increases the rigidity in the first grooves 10, promoting bending of portions of the sheet 2 other than the first grooves 10. That is, this makes it easy to bend the sheet 2 as if the entire sheet 2 is curved. As a result, the cross-sectional shape of the sheet 2 becomes a shape following the cross-sectional shape of the cable 100. In other words, a gap is hardly generated between an outer circumferential surface of the cable 100 and the first surface 21 of the sheet 2. Therefore, the noise reduction sheet 1 according to the present embodiment easily adheres to the cable 100, making it possible to suppress noise leakage.

The deformation of the sheet 2 by which the second grooves 20 and the third grooves 30 are closed has the same effect. Therefore, the noise reduction sheet 1 according to the present embodiment has a high degree of freedom in deformation when attached to an object, and has high followability to the shape of the object.

FIG. 10 illustrates a wire harness WH to which the noise reduction sheet 1 according to the present embodiment is applied. The wire harness WH includes a cable 100 and the noise reduction sheet 1 wound around the cable 100 with the first surface 21 facing inward. The noise reduction sheet 1 is fixed to the cable 100. A means for fixing the noise reduction sheet 1 to the cable 100 may be a fixing member such as a binding band, an adhesive or an adhesive sheet, or another means.

The noise reduction sheet 1 covers the entire circumference of the cable 100. The noise reduction sheet 1 may be wound around the cable 100 with its end portions overlapping each other. In this case, the end portion of the first surface 21 overlaps the end portion of the second surface 22. The noise reduction sheet 1 is configured to be able to reduce noise emission from the cable 100 to the outside. As will be described below, the groove width Wd of the groove 3 according to the present embodiment is determined according to a wavelength of a noise to be reduced (hereinafter, simply referred to as a "target wavelength $\lambda$").

The target wavelength $\lambda$ is determined, for example, according to a current flowing through the cable 100. When a current flows through the cable 100, a noise is emitted from the cable 100. The target wavelength $\lambda$ is determined from the wavelength of the emitted noise. The target wavelength $\lambda$ is, for example, a wavelength of a noise having the highest frequency among emitted noises. The target wavelength $\lambda$ may be a wavelength corresponding to a frequency of a switching circuit connected to the cable 100.

As illustrated in FIG. 11, the groove 3 according to the present embodiment has a narrow portion 3$d$. The narrow portion 3$d$ is a portion of which the groove width Wd corresponds to the half wavelength $\lambda/2$ or shorter of the target wavelength $\lambda$. The narrow portion 3$d$ includes the bottom of the groove 3, and is provided in a predetermined range along the groove width direction W. The narrow portion 3$d$ can regulate transmission of noise having the target wavelength $\lambda$ in a state where the sheet 2 has a flat plate shape illustrated in FIG. 11. The narrow portion 3$d$ can regulate transmission of noise having a wavelength longer than the target wavelength $\lambda$. When the sheet 2 is attached to an object, the groove width Wd of the narrow portion 3$d$ decreases. That is, in the groove 3, a portion that can regulate the transmission of noise having the target wavelength $\lambda$ spreads toward the opening 3$a$. Therefore, the noise reduction sheet 1 according to the present embodiment can effectively reduce noise having a wavelength equal to or longer than the target wavelength A.

The grooves 3 may have narrow portions 3$d$ in both the first sections 10$a$, 20$a$, and 30$a$ and the second sections 10$b$, 20$b$, and 30$b$. In this case, the second sections 10$b$, 20$b$, and 30$b$ having a relatively narrow width may entirely be narrow portions 3$d$. In the second sections 10$b$, 20$b$, and 30$b$ that are entirely narrow portions 3$d$, the groove width Wd of the opening 3$a$ corresponds to the half wavelength $\lambda/2$ or shorter.

In the first sections 10$a$, 20$a$, and 30$a$, the range in which the narrow portion 3$d$ is provided is arbitrary. As an example, the narrow portion 3$d$ may be provided in a range from the middle line Zm to the bottom of the groove 3. In this case, the groove width Wd at the middle line Zm corresponds to the half wavelength $\lambda/2$. The narrow portion 3$d$ may be provided closer to the bottom of the groove 3 than the middle line Zm without including the middle line Zm. Alternatively, the narrow portion 3$d$ may be provided in a range from a position half the depth Z2 of the groove 3 to the bottom.

The cross-sectional shape of the groove 3 is not limited to the exemplified shape. For example, the groove 3 may not have straight walls 3$c$. In this case, the groove 3 may have an entirely curved wall 3$b$. The groove 3 may not have a curved wall 3$b$. FIG. 12 illustrates an example of a cross-sectional shape of the groove 3 having no curved wall 3$b$. The cross-sectional shape of the groove 3 illustrated in FIG. 12 is a V-shape. The groove 3 has the pair of straight walls 3$c$. The bottom of the groove 3 may be provided closer to the second surface 22 than the middle line Zm. The groove 3 has the narrow portion 3$d$ having the groove width Wd corresponding to the half wavelength $\lambda/2$ or shorter. The narrow portion 3$d$ may be provided in a range from the middle line Zm to the bottom of the groove 3.

As described above, the noise reduction sheet 1 according to the present embodiment includes the flexible sheet 2 containing a soft magnetic material. The plurality of first grooves 10 extending in the first direction D1, the plurality of second grooves 20 extending in the second direction D2, and the plurality of third grooves 30 extending in the third direction D3 are provided on the first surface 21 of the sheet 2. The first surface 21 is divided into the plurality of regular triangular regions 21$t$ by the first grooves 10, the second grooves 20, and the third grooves 30. Each of the first grooves 10, the second grooves 20, and the third grooves 30 has a cross-sectional shape in which the groove width Wd increases toward the opening 3$a$ along the depth direction Z of the groove 3. Since the noise reduction sheet 1 according to the present embodiment has the plurality of grooves 3 extending in three directions, it is possible to improve the degree of freedom in deformation when the noise reduction sheet 1 is attached to an object.

The noise reduction sheet 1 according to the present embodiment can be manufactured at a lower cost than a conventional ferrite core. In addition, a dedicated jig or the like is unnecessary when the noise reduction sheet 1 is attached to an object. Therefore, the noise reduction sheet 1 according to the present embodiment has a high effect in terms of cost reduction. In addition, the noise reduction sheet 1 according to the present embodiment can realize improvement in merchantability by weight reduction. In addition, the noise reduction sheet 1 according to the present embodiment can also meet the needs of customers (EMC measures, cost reduction through improvement in productivity).

Each of the first grooves 10, the second grooves 20, and the third grooves 30 according to the present embodiment has the first sections 10$a$, 20$a$, or 30$a$ and the second sections 10$b$, 20$b$, or 30$b$. The second sections 10$b$, 20$b$, or 30$b$ have a narrower groove width Wd than the first sections 10$a$, 20$a$, or 30$a$. In each of the grooves, the first sections 10$a$, 20$a$, or 30$a$ and the second sections 10$b$, 20$b$, or 30$b$ are alternately arranged. The first sections 10$a$, 20$a$, or 30$a$ are arranged in such a manner that the first surface 21 is divided into the regular hexagonal regions 21$h$ constituting a honeycomb structure. The sheet 2 configured as described above can be flexibly deformed while stress concentration is suppressed.

The second sections 10*b*, 20*b*, or 30*b* according to the present embodiment are diagonal sections in the regular hexagonal regions 21*h*. Since the regular hexagonal regions 21*h* have diagonal grooves, the degree of freedom in deformation of the sheet 2 is improved. For example, the regular hexagonal regions 21*h* flexibly fit the curved surface.

Each of the first grooves 10, the second grooves 20, and the third grooves 30 according to the present embodiment has a cross-sectional shape curved outward in the groove width direction W. In the groove 3 having such a shape, the opening 3*a* is easily closed when the groove 3 is closed.

The wire harness WH according to the present embodiment includes the cable 100 and the above noise reduction sheet 1. The noise reduction sheet 1 is wound around the cable 100 with the first surface 21 facing inward. Each of the first grooves 10, the second grooves 20, and the third grooves 30 has the narrow portion 3*d* in which the groove width Wd is narrower than a predetermined width in a case where the noise reduction sheet 1 has a flat plate shape. The narrow portion 3*d* is provided in a predetermined range from the bottom in the depth direction Z of the groove 3. The predetermined width corresponds to the half wavelength λ/2 of noise generated from a current flowing through the cable 100. The wire harness WH including the noise reduction sheet 1 can effectively reduce a noise emitted from the cable 100.

The specific configurations of the first grooves 10, the second grooves 20, and the third grooves 30 are not limited to the configurations exemplified in the embodiment. For example, the number of regular triangular regions 21*t* included in the regular hexagonal region 21*h* is not limited to six. The regular hexagonal region 21*h* may include more than six regular triangular regions 21*t*.

The depth Z2 of the groove 3 may be different between the first sections 10*a*, 20*a*, or 30*a* and the second sections 10*b*, 20*b*, or 30*b*. In this case, the second sections 10*b*, 20*b*, or 30*b* may have a smaller depth than the first sections 10*a*, 20*a*, or 30*a*. As a result, the second sections 10*b*, 20*b*, or 30*b* have higher rigidity against a bending force F1 than the first sections 10*a*, 20*a*, or 30*a*.

The first grooves 10, the second grooves 20, and the third grooves 30 may not have second sections 10*b*, 20*b*, and 30*b*. In this case, the groove width Wd is constant along an extending direction of the groove 3.

The embodiments disclosed above can be carried out in an appropriate combination.

The noise reduction sheet according to the present embodiment has grooves in three directions for dividing the first surface into a plurality of regular triangular regions. The noise reduction sheet according to the present embodiment having grooves in three directions is advantageous in that the degree of freedom in deformation can be improved.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:
1. A noise reduction sheet comprising:
a flexible sheet containing a soft magnetic material, wherein a plurality of first grooves extending in a first direction, a plurality of second grooves extending in a second direction, and a plurality of third grooves extending in a third direction are provided on a first surface of the sheet, the first surface is divided into a plurality of regular triangular regions by the first grooves, the second grooves, and the third grooves, each of the first grooves, the second grooves, and the third grooves has a cross-sectional shape in which a groove width increases toward an opening along a depth direction of the groove, and wherein each of the first grooves, the second grooves, and the third grooves has first sections and second sections having a narrower groove width than the first sections, the first sections and the second sections being alternately arranged, and the first sections are arranged in such a manner that the first surface is divided into a plurality of regular hexagonal regions constituting a honeycomb structure.

2. The noise reduction sheet according to claim 1, wherein the second sections are diagonal sections in the regular hexagonal regions.

3. The noise reduction sheet according to claim 2, wherein each of the first grooves, the second grooves, and the third grooves has a cross-sectional shape curved outward in a groove width direction.

4. A wire harness comprising:
a cable; and
the noise reduction sheet according to claim 2, the noise reduction sheet being wound around the cable with the first surface facing inward, wherein each of the first grooves, the second grooves, and the third grooves has a narrow portion in which a groove width is narrower than a predetermined width in a case where the noise reduction sheet has a flat plate shape, the narrow portion is provided in a predetermined range from a bottom in the depth direction of the groove, and the predetermined width corresponds to a half wavelength of a noise generated from a current flowing through the cable.

5. The noise reduction sheet according to claim 1, wherein each of the first grooves, the second grooves, and the third grooves has a cross-sectional shape curved outward in a groove width direction.

6. A wire harness comprising:
a cable; and
the noise reduction sheet according to claim 1, the noise reduction sheet being wound around the cable with the first surface facing inward, wherein each of the first grooves, the second grooves, and the third grooves has a narrow portion in which a groove width is narrower than a predetermined width in a case where the noise reduction sheet has a flat plate shape, the narrow portion is provided in a predetermined range from a bottom in the depth direction of the groove, and the predetermined width corresponds to a half wavelength of a noise generated from a current flowing through the cable.

* * * * *